(12) United States Patent
Kirchmeier et al.

(10) Patent No.: US 8,482,205 B2
(45) Date of Patent: Jul. 9, 2013

(54) DRIVING SWITCHES OF A PLASMA LOAD POWER SUPPLY

(75) Inventors: Thomas Kirchmeier, Teningen (DE); Michael Glueck, Freiburg (DE); Hans-Juergen Windisch, Ehrenkirchen (DE); Hanns-Joachim Knaus, Emmendingen (DE)

(73) Assignee: HUETTINGER Elektronik GmbH + Co. KG, Freiburg (DE)

( * ) Notice: Subject to any disclaimer, the term of this patent is extended or adjusted under 35 U.S.C. 154(b) by 0 days.

(21) Appl. No.: 12/687,483

(22) Filed: Jan. 14, 2010

(65) Prior Publication Data
US 2010/0171428 A1 Jul. 8, 2010

Related U.S. Application Data

(63) Continuation of application No. PCT/EP2008/005980, filed on Jul. 22, 2008.

(60) Provisional application No. 60/951,392, filed on Jul. 23, 2007.

(51) Int. Cl.
*H01J 7/24* (2006.01)

(52) U.S. Cl.
USPC .................................... 315/111.21

(58) Field of Classification Search
USPC ............... 315/111.21, 209 R, 219, 291
See application file for complete search history.

(56) References Cited

U.S. PATENT DOCUMENTS

| 3,820,008 A | 6/1974 | Guarnaschelli |
| 4,053,848 A | 10/1977 | Kleische |
| 4,215,392 A | 7/1980 | Rhoads |
| 4,490,684 A | 12/1984 | Epsom et al. |
| 4,656,434 A | 4/1987 | Selin |
| 4,701,716 A | 10/1987 | Poole |
| 4,758,941 A | 7/1988 | Felton et al. |

(Continued)

FOREIGN PATENT DOCUMENTS

| EP | 0073059 | 3/1983 |
| EP | 1272014 | 1/2003 |

(Continued)

OTHER PUBLICATIONS

De Vries et al., "Solid State Class DE RF Power Source", Proc. IEEE International Symposium on Industrial Electronics (ISIE'98), vol. 2, pp. 524-529, Pretoria, South Africa, Jul. 1988.

(Continued)

*Primary Examiner* — Douglas W Owens
*Assistant Examiner* — Amy Yang
(74) *Attorney, Agent, or Firm* — Fish & Richardson P.C.

(57) ABSTRACT

Operation of a plasma supply device having at least one switching bridge with at least two switching elements, and configured to deliver a high frequency output signal having a power of >500 W and a substantially constant fundamental frequency >3 MHz to a plasma load is accomplished by determining at least one operating parameter, at least one environmental parameter of at least one switching element and/or a switching bridge parameter, determining individual drive signals for the switching elements taking into account the at least one operating parameter, the at least one environmental parameter and/or the switching bridge parameter, and individually driving the switching elements with a respective drive signal.

17 Claims, 9 Drawing Sheets

U.S. PATENT DOCUMENTS

| | | |
|---|---|---|
| 4,860,189 A | 8/1989 | Hitchcock |
| 4,910,452 A | 3/1990 | Dickens et al. |
| 4,921,357 A | 5/1990 | Karube et al. |
| 4,980,810 A | 12/1990 | McClanahan et al. |
| 5,195,045 A | 3/1993 | Keane et al. |
| 5,222,246 A | 6/1993 | Wolkstein |
| 5,225,687 A | 7/1993 | Jason |
| 5,363,020 A | 11/1994 | Chen et al. |
| 5,382,344 A | 1/1995 | Hosokawa et al. |
| 5,394,061 A * | 2/1995 | Fujii ................ 315/111.21 |
| 5,424,691 A | 6/1995 | Sandinsky |
| 5,434,527 A | 7/1995 | Antone |
| 5,435,881 A | 7/1995 | Ogle |
| 5,438,498 A | 8/1995 | Ingemi |
| 5,523,955 A | 6/1996 | Heckman |
| 5,563,775 A | 10/1996 | Kammiller |
| 5,574,410 A | 11/1996 | Collins et al. |
| 5,610,452 A | 3/1997 | Shimer et al. |
| 5,635,762 A | 6/1997 | Gamand |
| 5,810,963 A | 9/1998 | Tomioka |
| 5,875,103 A | 2/1999 | Bhagwat et al. |
| 5,944,942 A | 8/1999 | Ogle |
| 6,038,142 A * | 3/2000 | Fraidlin et al. ............ 363/17 |
| 6,084,787 A * | 7/2000 | Nyberg et al. ............ 363/51 |
| 6,130,831 A * | 10/2000 | Matsunaga ............ 363/98 |
| 6,229,718 B1 | 5/2001 | Nilssen |
| 6,246,599 B1 | 6/2001 | Jang et al. |
| 6,297,696 B1 | 10/2001 | Abdollahian et al. |
| 6,313,584 B1 | 11/2001 | Johnson et al. |
| 6,344,768 B1 | 2/2002 | Daun-Lindberg et al. |
| 6,365,868 B1 | 4/2002 | Borowy et al. |
| 6,703,080 B2 | 3/2004 | Reyzelman et al. |
| 6,704,203 B2 | 3/2004 | Chapuis et al. |
| 6,760,234 B2 | 7/2004 | Yuzurihara et al. |
| 6,777,881 B2 | 8/2004 | Yuzurihara et al. |
| 6,791,851 B2 | 9/2004 | Brkovic |
| 6,909,617 B1 | 6/2005 | Mirskiy |
| 6,992,902 B2 | 1/2006 | Jang et al. |
| 6,996,892 B1 | 2/2006 | Dening et al. |
| 7,138,861 B2 | 11/2006 | Sundström et al. |
| 7,161,818 B2 | 1/2007 | Kirchmeier et al. |
| 7,244,343 B2 | 7/2007 | Watanabe et al. |
| 7,259,623 B2 | 8/2007 | Coleman |
| 7,312,584 B2 | 12/2007 | Tamita et al. |
| 7,333,348 B2 | 2/2008 | Horiuchi et al. |
| 7,353,771 B2 | 4/2008 | Millner et al. |
| 7,403,400 B2 | 7/2008 | Stanley |
| 7,452,443 B2 | 11/2008 | Glueck et al. |
| 7,616,462 B2 * | 11/2009 | Millner et al. ............ 363/63 |
| 7,755,300 B2 | 7/2010 | Kishinevsky et al. |
| 7,796,005 B2 | 9/2010 | Blankenship et al. |
| 7,872,523 B2 | 1/2011 | Sivakumar et al. |
| 7,884,590 B2 | 2/2011 | Liu |
| 2003/0215373 A1 | 11/2003 | Reyzelman et al. |
| 2004/0031566 A1 | 2/2004 | Takahashi et al. |
| 2004/0105288 A1 | 6/2004 | Watanabe et al. |
| 2004/0114399 A1 | 6/2004 | Lincoln et al. |
| 2005/0088231 A1 | 4/2005 | Ziegler |
| 2005/0088855 A1 * | 4/2005 | Kirchmeier et al. ............ 363/17 |
| 2005/0122087 A1 | 6/2005 | Sakai et al. |
| 2005/0255809 A1 | 11/2005 | Glueck |
| 2006/0158911 A1 * | 7/2006 | Lincoln et al. ............ 363/56.01 |
| 2006/0191880 A1 * | 8/2006 | Kwon et al. ............ 219/121.57 |
| 2006/0196426 A1 * | 9/2006 | Gluck et al. ............ 118/723 R |
| 2006/0252283 A1 | 11/2006 | Takeda et al. |
| 2007/0121267 A1 | 5/2007 | Kotani et al. |
| 2007/0145900 A1 | 6/2007 | Kirchmeier et al. |
| 2009/0153127 A1 | 6/2009 | Chen |

FOREIGN PATENT DOCUMENTS

| | | |
|---|---|---|
| EP | 1783904 | 10/2005 |
| EP | 1701376 | 9/2006 |
| JP | 55082967 | 6/1980 |
| JP | 9120910 A | 5/1997 |
| JP | 10214698 A | 8/1998 |
| JP | 10215160 A | 8/1998 |
| JP | 2001128458 A | 5/2001 |
| JP | 2001185443 A | 7/2001 |
| JP | 2002237419 A | 8/2002 |
| JP | 2005086622 A | 3/2005 |
| JP | 2006165438 A | 6/2006 |
| JP | 2007151331 A | 6/2007 |
| WO | 9749267 | 12/1997 |
| WO | 9857406 | 12/1998 |
| WO | 2005094138 | 6/2005 |

OTHER PUBLICATIONS

Walker et al., "An Isolated MOSFET Gate Driver". Australasian Universities Power Engineering Conference, AUPEC'96, 1996, vol. 1, Melbourne, pp. 175-180.

International Search Report from corresponding PCT Application No. PCT/EP2008/005980, mailed Oct. 15, 2008, 2 pages.

Notification of Transmittal of Translation of the International Report on Patentability, mailed Feb. 18, 2010, 7 pages.

* cited by examiner

Fig. 13 ated via ports 1 and 2 towards the high frequency amplifiers of
DRIVING SWITCHES OF A PLASMA LOAD POWER SUPPLY

CROSS REFERENCE TO RELATED APPLICATION

This application is a continuation of PCT International Application No. PCT/EP2008/005980, filed Jul. 22, 2008, incorporated herein by reference, which claims priority under 35 U.S.C. §119(e) to U.S. Patent No. 60/951,392, filed on Jul. 23, 2007, hereby incorporated by reference in its entirety.

TECHNICAL FIELD

The invention relates the operation of a plasma supply device having at least one switching bridge comprising at least two switching elements, and configured to deliver a high frequency output signal having a power of >500 W and a substantially constant fundamental frequency >3 MHz to a plasma load.

BACKGROUND

A plasma is a special aggregate state, which is produced from a gas. Each gas essentially comprises atoms and/or molecules. In the case of a plasma, this gas is for the most part ionized. This means that by supplying energy, the atoms or molecules are split into positive and negative charge carriers, that is, into ions and electrons. A plasma is suitable for the processing of workpieces, since the electrically charged particles are chemically extremely reactive and can also be influenced by electrical fields. The charged particles can be accelerated by means of an electrical field onto a workpiece, where, on impact, they are able to extract individual atoms from the workpiece. The separated atoms can be removed via a gas flow (etching), or deposited as a coating on other workpieces (thin-film production). Such processing by means of a plasma is used above all when extremely thin layers, in particular in the region of a few atom layers, are to be processed. Typical applications are semiconductor technology (coating, etching etc.), flat screens (similar to semiconductor technology), solar cells (similar to semiconductor technology), architectural glass coating (thermal protection, glare protection, etc.), memory media (CDs, DVDs, hard drives), decorative layers (colored glasses etc.) and tool hardening. These applications make great demands on accuracy and process stability. Furthermore, a plasma can also be used to excite lasers, in particular gas lasers.

To generate a plasma from a gas, energy has to be supplied to the gas. This can be effected in different ways, for example, via light, heat, and/or electrical energy. A plasma for processing workpieces is typically ignited and maintained in a plasma chamber. To that end, normally a noble gas, e.g. argon, is introduced into the plasma chamber at low pressure. The gas is exposed to an electric field via electrodes and/or antennas. A plasma is generated and is ignited when several conditions are satisfied. First of all, a small number of free charge carriers must be present, in which case the free electrons that for the most part are always present to a very small extent are used. The free charge carriers are so forcefully accelerated by the electrical field that as they collide with atoms or molecules of the noble gas they release additional electrons, thereby producing positively charged ions and additional negatively charged electrons. The additional free charge carriers are in turn accelerated and, as they collide, generate additional ions and electrons. An avalanche effect commences. The discharges that occur as these particles collide with the wall of the plasma chamber or other objects and the natural recombination of the particles counteract the continuous generation of ions and electrons, i.e., electrons are attracted by ions and recombine to form electrically neutral atoms or molecules. For that reason, an ignited plasma must be constantly supplied with energy in order for it to be maintained.

The supply of energy can be effected via a dc supply device or an ac supply device. The following remarks relate to ac supply devices for high frequency (HF) with an output frequency of >3 MHz.

Plasmas have a very dynamic impedance, which renders the design of the desired uniform HF power supply difficult. For instance, during the ignition process the impedance changes very quickly from a high value to a low value. Negative effective resistances can occur during operation, which reduce the current flow as the voltage rises, and undesirable local discharges (arcs) may occur, which may damage the material to be processed, the plasma chamber or the electrodes.

Power supply devices for plasmas (plasma supply devices) must therefore be designed for a high output power and a high reflected power. EP 1 701 376 A1 has shown that such plasma supply devices can advantageously be achieved by relatively small high frequency amplifiers, the output powers of which are coupled by a coupler, preferably by a 3-dB coupler (e.g., hybrid coupler, Lange coupler, etc.). For that purpose, the two high frequency amplifiers are connected to two ports of the hybrid coupler, hereafter called port 1 and port 2. The high frequency amplifiers are driven in such a way that their high frequency signals of the same fundamental frequency have a phase shift of 90° with respect to one another. At a third port of the hybrid coupler the first of the two high frequency signals is present lagging by 45°, and the second of the two high frequency signals is present leading by 45°. At a fourth port of the hybrid coupler the first of the two high frequency signals is present leading by 45° and the second lagging by 45°. By phase shifting of the two generated high frequency signals by 90°, these add up at the third port by constructive superposition, whereas at the fourth port they cancel each other out (destructive superposition). The high frequency amplifiers upstream of the coupler thus each require only half the power of the required high frequency output signal. These coupler stages can be cascaded to enable the use of high frequency amplifiers with even less source power or to achieve an even higher power of the high frequency output signal.

The fourth port of the hybrid coupler is normally terminated with a terminating resistance of the system impedance (often 50Ω). As described in EP 1 701 376 A1, a high frequency signal is expected at this port only when a high frequency signal reflected by the plasma load is in turn reflected at the high frequency amplifiers.

In the case of mismatching due to different impedances of plasma supply device and plasma load, the power delivered by the plasma supply device is partially or fully reflected. An impedance matching circuit (matchbox) can transform the impedance of the plasma load in certain ranges and match it to the output impedance of the plasma supply device. If the transformation range of the matching circuit is exceeded, or if regulation of the impedance matching circuit cannot follow a rapid impedance change of the plasma, then the total power delivered by the plasma supply device is not absorbed in the plasma, but rather reflection occurs again.

A high frequency signal reflected by the plasma load runs via an optionally present matching circuit back to port 3 of the hybrid coupler, where it is split into two parts and retransmitted via ports 1 and 2 towards the high frequency amplifiers of the plasma supply device. In the process, the two parts of the reflected high frequency signal again experience an equal phase delay by 45° en route from port 3 to port 1 and an equal phase lead by 45° en route from port 3 to port 2. The result being that, at both outputs of the two high frequency amplifiers, the in-running and reflected high frequency signals are superimposed differently by 180°. If, for example, a maximum constructive superposition of in-running (forward) and reflected high frequency signal takes place at the output of the first high frequency amplifier, then this superposition will have maximum destruction at the output of the second high frequency amplifier. If the superposition at the first high frequency amplifier is such that the current maximum is ahead of the voltage maximum in time, i.e. the high frequency amplifier sees a capacitive impedance as load impedance, then the voltage maximum will be ahead of the current maximum in time at the second high frequency amplifier, i.e. the second high frequency amplifier sees an inductive load impedance.

One circuit variant of high frequency amplifiers in plasma current supplies is a class D amplifier with a switching bridge. A switching bridge has at least two switching elements, such as e.g. MOSFETs, which are connected in series; the junction of the switching elements represents the midpoint of the switching bridge. The midpoint of the bridge arm is connected alternately to the positive or negative pole of a power D.C. supply by the two switch elements (hereafter also called switching elements or switches). The alternating control of the two switch elements and of the switch elements of any second bridge arm present is effected by the drive signal generator, which can contain an oscillator, which determines the frequency of the output signal, and further components, such as inverters, phase shifters and signal formers. A switching bridge with two switching elements is also called a half-bridge.

A full bridge circuit consists of two bridge arms (half-bridges), the midpoints of which are connected at the desired frequency in each case inversely to the positive and negative pole of the d.c. supply. The alternating current load is arranged between these two midpoints. An additional capacitor to free the output signal from a D.C. offset is unnecessary. A full bridge (circuit) is accordingly a switching bridge with four switching elements.

To avoid switching losses, at the time the individual switch elements of a full bridge are switched on, there should be no appreciable voltage difference between the two power electrodes (generally drain and source of the MOSFET in question). This switching behavior is called zero voltage switching. This is achieved by the switching bridge operating on a load impedance having an inductive character. This means that the switching bridge sees an inductively absorptive load impedance. The self-induction of a primary winding of a power transformer that is connected to the midpoint of the switching bridge can be used for that purpose. A voltage is induced upon the initially one-sided interruption of the current flow through the primary winding. When the components are of suitable dimensions and allowances are made for their parasitic properties, and with the correct choice of switching/delay time, the potential at this end of the primary winding not at that moment connected to the power D.C. supply is just as high as the potential at the particular connection of the direct voltage source that is now to be connected to this end of the primary winding with this half-bridge.

In contrast, a load impedance of a capacitive character (the switching bridge sees a capacitively absorptive load impedance) is unfavorable for the switching bridge, as the midpoint retains its previous potential during the switching-over procedure and thus a voltage difference up to the voltage of the power D.C. supply is present at the element now switching on. Apart from that, current surges may arise when switching the second switching element of a switching bridge in combined effect with parasitic capacitances.

If the output signals of two switching bridges are coupled via a coupler, under certain reflection conditions it may even happen that one of the switching bridges, in particular a half-bridge, supplies power to the other switching bridge, in particular a half-bridge.

The load impedance seen by this switching bridge to which power is supplied has a negative effective resistance. Hence the output power of this switching bridge becomes negative. The switching bridge is, as it were, "fed". This means that the "fed" switching bridge sees an emissive load impedance, which can be, real, inductive or capacitive.

Depending on the operating states and the specifications of the components of the switching bridge, that is, how close to the specification limit these are operated with the supply voltage, how good the cooling is, how quickly the normal operation (switching operation) of the switching elements of the switching bridge can be terminated, how well zero voltage switching has to be realized, an admissible operating range arises. If therefore the load impedance lies in an operating range dependent on the component specifications and operating states of the switching bridges, the switching bridges can be operated without fear of damage or destruction. At the same time, even certain (inductive) emissive load impedances may be admissible. Load impedances outside the admissible load impedance range should be avoided.

One drawback of some known solutions is that the switching elements of the half-bridges are often simply driven only complementarily, that is, alternately. Optionally, a dead time is maintained between the alternating driving. The switching elements in full bridges are often driven simply crosswise. A dead time may also be provided in this case.

SUMMARY

One aspect of the invention features a method in which each switching element has its own driver and can be separately driven. On the basis of determined electrical and/or other parameters for each switching element, an individual drive signal can be determined for each switching element and this switching element can be correspondingly driven in order to avoid an overload at the switching element and consequently destruction of the switching bridge. With this approach, a plasma supply device can be safeguarded against destruction of the switching elements even without absorbing filters. This is especially important and advantageous in the case of plasma supply devices, since mismatching and chaotic states often arise where plasma loads are involved.

Electrical parameters, in particular the current through the switching element, the voltage at the switching element, the current path or the voltage profile can be determined as operating parameters. The temperature of a switching element, for example, can be determined as environmental parameter. A variable related to the load impedance seen by the switching bridge can be determined as switching bridge parameter. In this connection, provision can be made for the operating parameters for each switching element to be measured. This means increased effort for measuring, but less effort for computation, since nothing needs to be inferred or back-calculated from measured values for the one switching element with regard to corresponding operating parameters of other switching elements.

It is also conceivable to measure the operating parameters of just one or a few switching elements and from these to determine the operating parameters of the other switching elements. This procedure reduces the effort involved in measuring, but increases the effort involved in computation for determining the operating parameters of the other switching elements. For example, from a pair of measured values (e.g. amplitude and phase angle) for the load impedance seen for a switching bridge, and from the measurement of operating parameters at only one or two switching elements, back-calculations can be made for the variations with time of the electrical parameters at the remaining switching elements. The measurements can be effected via optical waveguides, or at least the measurement results can be forwarded or transmitted via optical waveguides. A measurement can also be effected via an accompanying line. In this respect, reference is made to the PCT applications with the file references PCT/EP2008/002657 and PCT/EP2008/004650, the content of which is herewith incorporated as subject matter of this application.

Furthermore, provision can be made for the operating parameters of the other switching elements to be determined, taking into account a calibration measurement, a simulation or representative values. On the basis of a limited set of measured values, e.g. the pair of measured values for the load impedance or the power emitted by a switching bridge and the power reflected to it, operating parameters for the other switching elements can be determined. In particular, conclusions can be drawn regarding the variations with time of the electrical parameters at all switching elements, based on a reduced set of data. For that purpose, a calibration measurement can be carried out at the switching elements for all operating states. Alternatively, a simulation of the switching bridge can be performed. Representative values for the individual switching elements can also be known (and stored) and taken into account when determining the operating parameters.

The simulation of the switching bridge or the switching elements can be performed in real time during analysis of the operating parameters.

Furthermore, provision can be made for the output power of two switching bridges to be coupled via a coupler and, at least three ports of the coupler, for the amplitude of a signal present at the respective port to be measured. Thus, the operating parameters of the individual switching elements can be determined with a small number of measurements. In this respect reference is made to the PCT application PCT/EP2008 005241, the content of which is herewith incorporated as subject matter of this application.

Furthermore, the curve forms of the measured values detected can be analyzed, for example, by carrying out a Fourier analysis. On the basis of the analysis, conclusions can be drawn regarding the operating parameters at each individual switching element. In order to be able to carry out such an analysis, the measurements must be carried out with a high time resolution, since, according to the Nyquist criterion, the sampling frequency has to be at least twice as high as the highest anticipated signal frequency.

Driving of a switching element or a group of switching elements can be specifically varied and the resulting change in the operating parameters, environmental parameters and/or switching bridge parameters can be analyzed. For instance, conclusions can be drawn regarding the electrical parameters present at each switching element. For example, one can determine whether an earlier on-phase results in more or less power at the output of the switching bridge. This is especially significant if a plurality of switching bridges are coupled via a coupler, for example, a hybrid coupler. Here, coupling of the signals that come from the switching bridges takes place based on the phase.

The output power of the plasma supply device can be detected and regulated to a desired value. The regulation of the output power can in that case be effected so that the switching elements in the switching bridges are correspondingly driven and one or more values for current, voltage and power are measured or determined for each switching bridge and taken into account when regulating the power. In particular, by driving the switching elements the output power of each individual switching bridge can be adjusted, by specifically driving the switching elements in the switching bridges. To control or regulate the power of the switching bridges, the phase shift method known per se can be used, for example.

On the basis of the operating parameters, environmental parameters and/or switching bridge parameters measured, an optimum switching schedule for each individual switching element can be determined, so that the actual output power corresponds as well as possible to the predetermined desired output power. Driving of the switching element can be effected in this case so that a lowest possible power loss in the switching bridges is generated. Moreover, driving of the switching elements can be effected so that these are protected against excess voltage, overcurrent, high voltage changes, high current changes or excess temperature.

Provision may be made for a switching element, during the time that it actually ought to be nonconductive, to be switched on briefly. This provides protection against voltage peaks that are caused by switching of the other switching elements and inductances of the switching bridge.

In the case of a full bridge, provision can be made for the diagonally arranged switching elements to be alternately loaded. For example, the upper switching element of the first switching bridge can switch the current flow to the lower switching element of the other switching bridge, whilst the lower switching element of the second switching bridge is already on. The lower switching element of the second switching bridge can subsequently switch on the current flow whilst the upper switching element of the first switching bridge is already on. An analogous algorithm can be used when switching off. Random sequences when switching on and switching off the switching elements can also be performed.

Based on the determination of the operating parameters, environmental parameters and/or switching bridge parameters, overloaded switching elements can be identified. Such switching elements can then be switched off. In addition, a warning, in particular an optical or acoustic signal, can be given.

To prevent damage to switching elements, provision can also be made for one or more switching elements to be maintained in a nonconductive state for one or more periods of the fundamental frequency. This measure can also be applied in order to control the output power of the switching bridge.

The drive signals can be determined by means of an algorithm, in which case the algorithm can be designed to be self-learning or designed by means of fuzzy logic.

At least one time-dependent measuring signal can be down-mixed to an intermediate frequency. For example, a complex mixing into the baseband can be effected and an evaluation performed in the baseband. In particular, time-dependent signals can be down-mixed to an intermediate frequency prior to digitization. Mixing can be effected in an analogue or digital form.

In this connection, various embodiments are conceivable. A driver and the associated switching elements can be arranged in a common housing. A half-bridge with drivers associated with the switching elements can also be arranged in a common housing. Likewise, a full bridge with drivers associated with the switching elements can be arranged in a common housing. If a plurality of components are accommodated in a common, in particular closed, housing, relatively short connection lines can be used, so that inductances can thereby be reduced. In addition, relatively short clearance distances can be achieved, without risk of flashovers, because the risk of contamination is lower and consequently minimum leakage paths can be made shorter. If the components are encapsulated in a housing, even shorter clearance distances can be achieved, without the risk of flashovers.

According to one embodiment, a common drive signal generator can be provided for all switching elements. An analysis of the operating parameters, environmental parameters and switching bridge parameters can therefore be carried out at a central location, and on the basis of these parameters a suitable drive signal for each individual switching element can be centrally determined. In this connection, the drive signal generator can be in the form of a digital module, in particular in the form of a DSP. If the drive signal generator is in the form of a digital component, it is furthermore advantageous for an analogue/digital converter to be connected downstream of the at least one measuring device and to be able to make digital signals available to the drive signal generator. In this connection, the analogue-digital converter can be integrated in the drive signal generator. A simplified evaluation of the measuring signals detected can be achieved if a mixer for down-mixing time-dependent measuring signals to an intermediate frequency is provided. This mixer is preferably connected upstream of an analogue/digital converter.

To generate a higher output power, the outputs of two switching bridges can be coupled by way of a coupler. In particular, the coupler can be in the form of a hybrid coupler, Wilkinson coupler or similar. Phasing lines can also be provided, in order to influence the phase of the output signals of individual switching bridges, so that the signals arrive at the coupler in a suitable phase position and can there be coupled in an optimum manner, i.e. with minimal power loss.

An algorithm for determining the drive signals for the switching elements can be implemented as a circuit or software in the drive signal generator. With this configuration, on the basis of measuring signals of just a few switching elements it is possible to determine the drive signals especially quickly, and also to evaluate measuring signals and determine operating parameters rapidly.

Further features and advantages of the invention will be apparent from the following description of exemplary embodiments of the invention, from the Figures of the drawings, which show details essential to the invention, and from the claims. The individual features can be embodied individually or jointly in any combination in a variant of the invention.

DESCRIPTION OF DRAWINGS

Preferred exemplary embodiments of the invention are illustrated schematically in the drawings and are explained in detail below with reference to the Figures of the drawings, in which.

DETAILED DESCRIPTION

Figure 1:
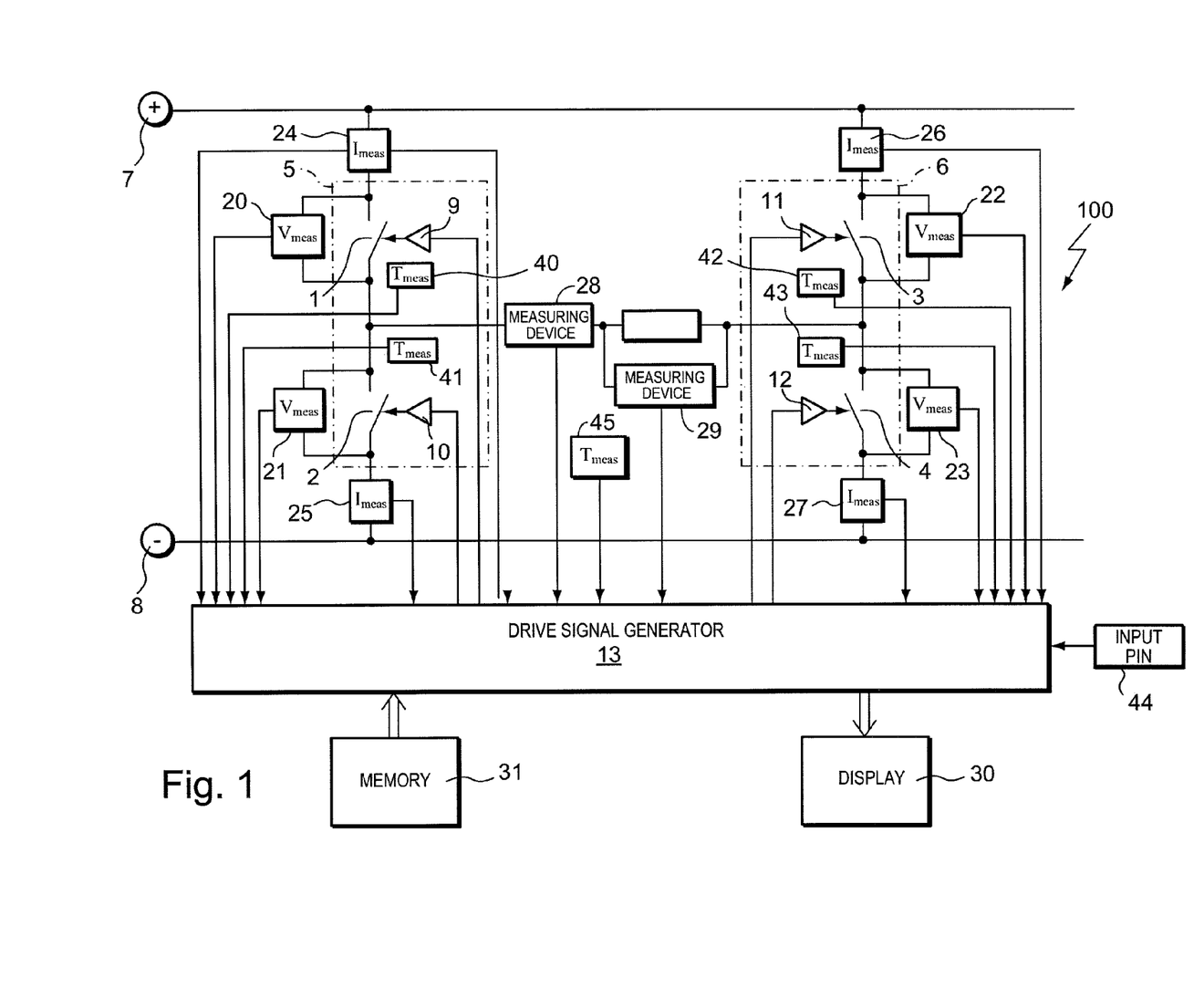
FIG. 1 shows an embodiment of a switching bridge, in which the operating parameters of the switching elements of the switching bridge are detected.

FIG. 1 illustrates a switching bridge 100 in the form of a full bridge. The switching bridge 100 comprises a first half-bridge with two series-connected switching elements 1, 2 and a second half-bridge with two series-connected switching elements 3, 4. Each switching element 1, 2, 3, 4 in the form of a transistor is driven by a driver 9, 10, 11, 12, the drivers 9, 10, 11, 12 being connected to a drive signal generator 13, which outputs drive signals to the drivers 9, 10, 11, 12. By adjusting the drive signals, the power at the output of the switching bridge 100 can be adjusted. The drivers 9, 10, together with the half-bridge with the switching elements 1, 2, can be housed in a half-bridge module 5. The same applies to the drivers 11, 12 and the half-bridge comprising the switching elements 3, 4 in the half-bridge module 6. Similarly, temperature-measuring elements 40, 41, 42, 43 are also disposed in the vicinity of the switching elements 1, 2, 3, 4, and can likewise be housed in the half-bridge modules 5, 6. The temperature may, of course, also be measured at further points, as shown by way of example by the measuring element 45. The temperature-measuring elements 40, 41, 42, 43 are connected to the drive signal generator 13 and supply this with corresponding measuring signals.

The upper switching element 1, 3 of each half-bridge is connected to the positive pole 7 of a d.c. supply voltage, whilst the lower switching element 2, 4 of each half-bridge is connected to the negative pole 8 of the d.c. supply voltage.

To measure the operating parameters of the switching elements 1 to 4, measuring devices 20 to 23 for measuring the voltage across the switching elements 1 to 4 are provided. These measuring devices are in connection with the drive signal generator 13 and supply this with corresponding measuring signals. Furthermore, measuring devices 24 to 27 for measuring the current in the individual switching elements 1 to 4 are provided, which likewise deliver their measuring signals to the drive signal generator 13. Switching bridge parameters, such as, for example, the output current or power, can be detected by the measuring device 28. The output voltage as a further switching bridge parameter can be detected by the measuring device 29. These measuring devices 28, 29 are also connected to the drive signal generator 13. By means of the measuring signals, the drive signal generator is able to generate individual drive signals for the switching elements 1 to 4. When one of the switching elements is overloaded or has even already been destroyed, information can be sent to an operator, for example, via a display device 30. External measured values, which provide information about the plasma for example, can be supplied to the drive signal generator 13 via an input pin 44 connected to the drive signal generator 13, and can be taken into account in the generation of drive signals.

To generate the drive signals and to analyze the measuring signals, it is possible to use data that can be stored in a memory 31 and can be retrieved by the drive signal generator 13. For example, data relating to the individual switching elements can be stored in the memory device 31.

Figure 2:
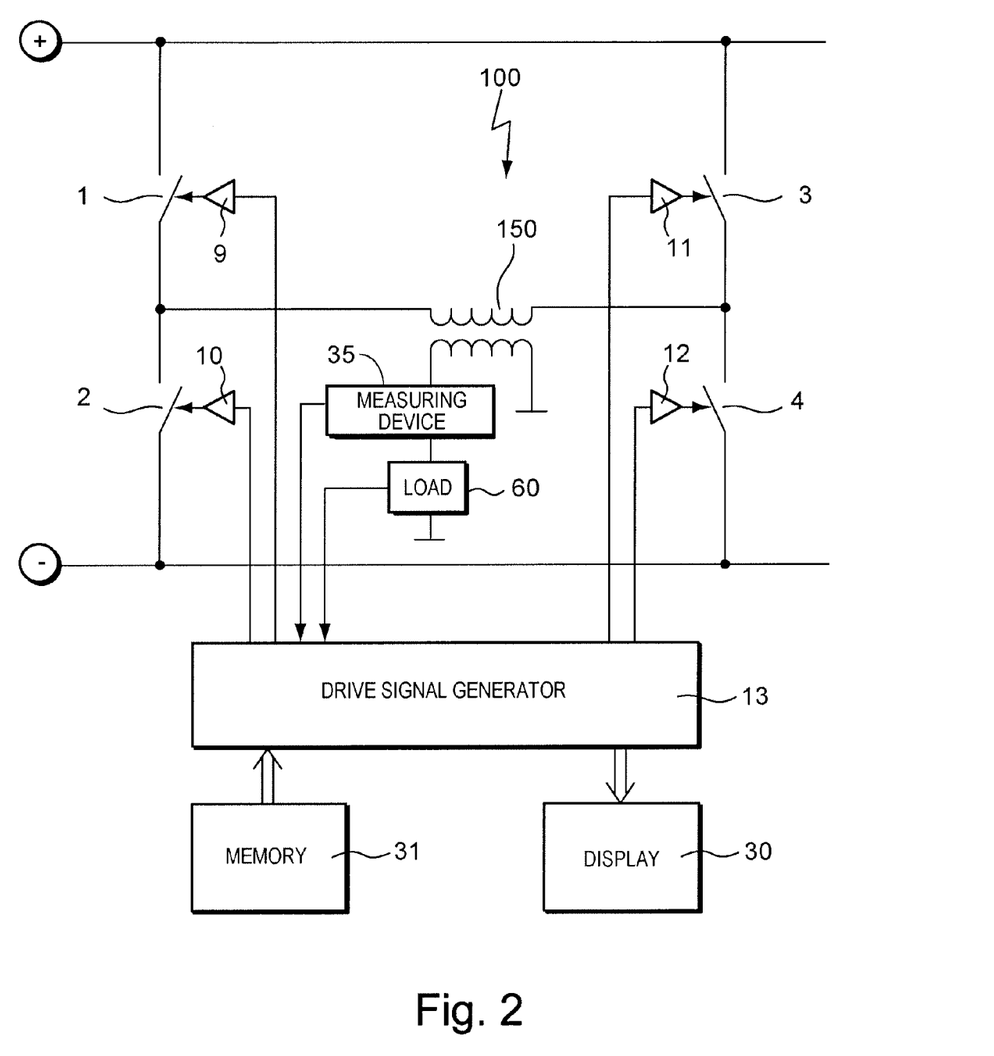
FIG. 2 shows a construction of a switching bridge, in which the output power of the switching bridge is detected.

FIG. 2 corresponds substantially to FIG. 1. Unlike FIG. 1, FIG. 2 shows that the output power of the switching bridge 11 can be output via an output transformer 150 to a load 60. The power supplied in the direction of the load 60 and the power reflected by the load 60 in the event of mismatching can be detected in a measuring device 35 and relayed to the drive signal generator 13. On the basis of these measuring signals, which are likewise switching bridge parameters, conclusions can be drawn in the drive signal generator 13 with regard to the operating parameters and operating states of the individual switching elements 1 to 4. Starting from this information, a suitable drive signal can therefore be generated for each switching element 1 to 4. Analysis of the measuring signals and the back-calculation on the basis of the measuring signals to the operating parameters at individual switching elements 1 to 4 can be effected by means of data stored in the memory 31. For example, simulation results can be stored there.

Figure 3:
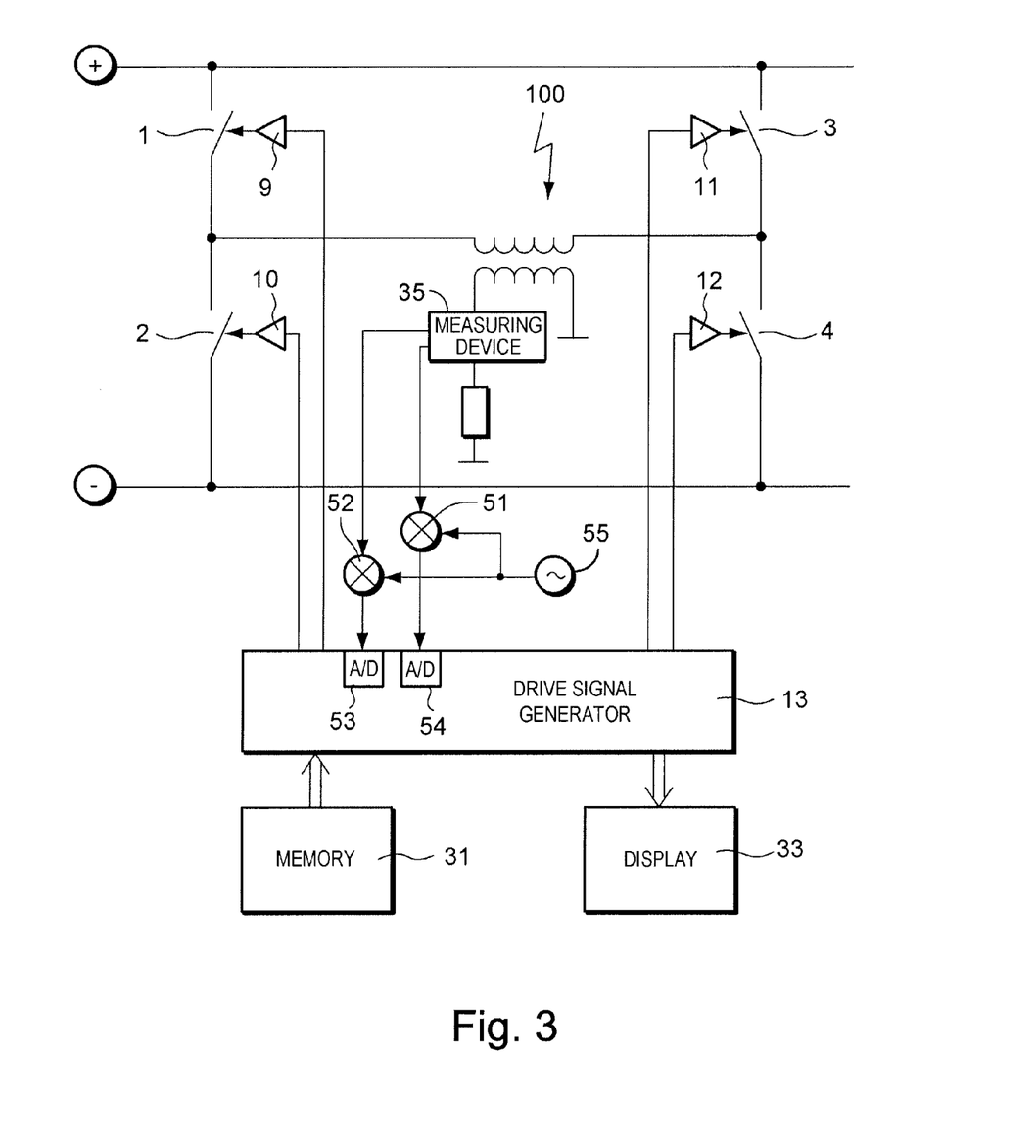
FIG. 3 shows a construction of a switching bridge, in which measuring signals are down-mixed to a intermediate frequency.

FIG. 3 shows in addition with respect to FIG. 2 that the measuring signals obtained by the measuring device 35 can be mixed in mixers 51, 52 with a frequency generated in a frequency generator 55, and can consequently be downmixed to an intermediate frequency. Subsequently, the downmixed signals can be processed in the drive signal generator 13. A/D converters 53, 54, by which the analogue signals are converted into digital signals, can be provided in the drive signal generator. The further processing of the signals can be effected digitally. For that purpose, it is advantageous for the drive signal generator 13 to be in the form of a digital signal processor.

Figure 4:
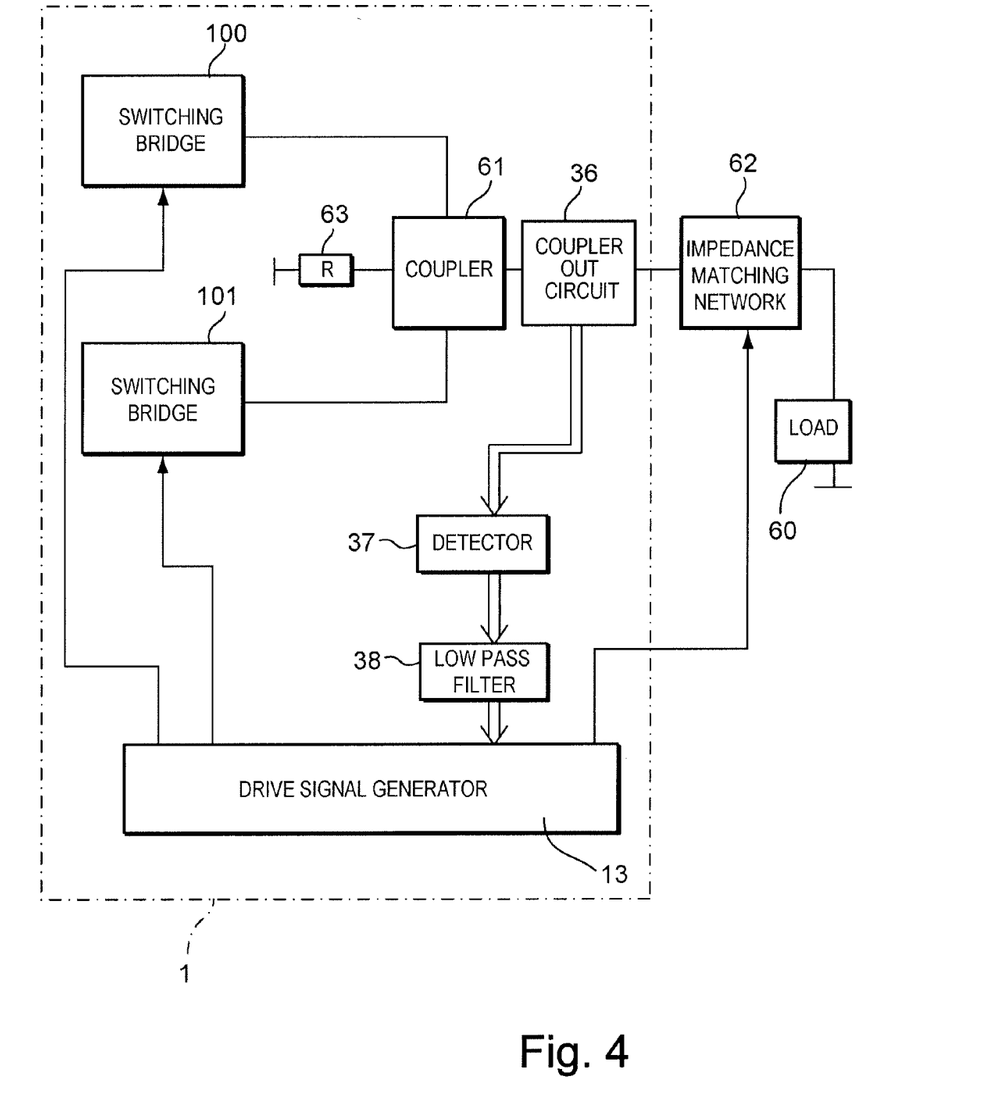
FIG. 4 shows schematically two switching bridges, which are coupled by way of a coupler.

In FIG. 4, two switching bridges 100,101 are shown in simplified form, their outputs being coupled by way of a coupler 61, which can be in the form of a hybrid coupler. An output power of the coupler 61 can be transferred via an impedance matching network 62 to the plasma load 60. A coupling out circuit 36 can be connected as a measuring device to the load-side port of the coupler 61, and can in turn be connected to a detector 37. A low-pass filter 38 can be connected to the detector 37. The resulting signal is relayed to the drive signal generator 13. Power that is not delivered to the load 60 lands in the absorber resistance 63.

Figure 5:
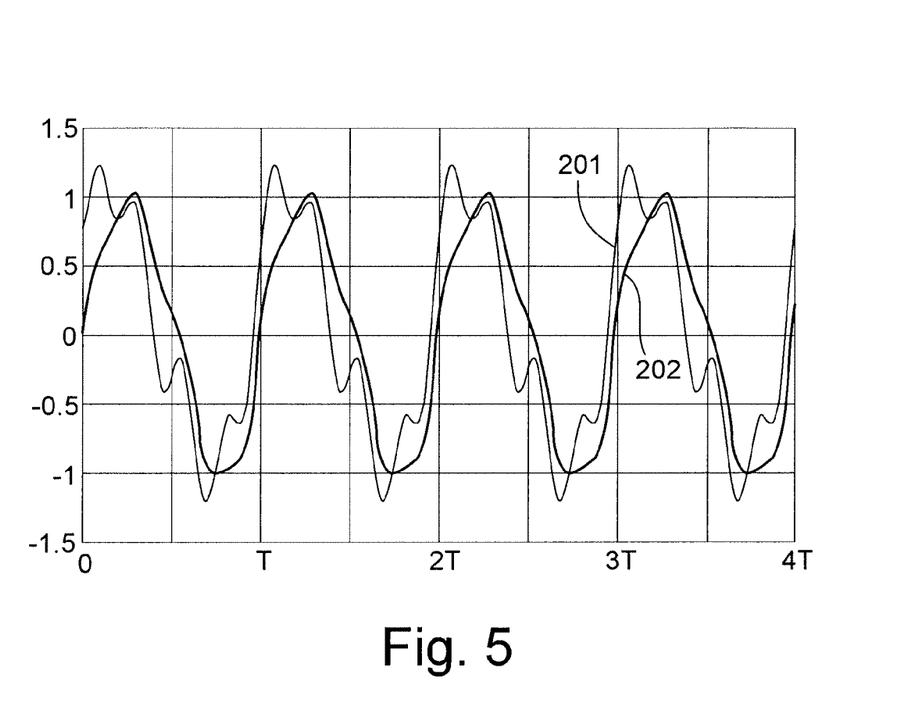
FIG. 5 shows a schematic representation of two wave trains.

FIG. 5 shows a schematic example of two wave trains 201, 202 with harmonic waves. For example, they can represent the current and the voltage at the output of a switching bridge. From the analysis of the wave trains 201, 202, conclusions can be drawn regarding the operating parameters, in particular the electrical states at the switching elements of the switching bridge. Changes in the driving of one or more of the switching elements can alter the wave trains 201, 202. From the change, conclusions can be drawn regarding the response of the switching elements.

Figure 6:
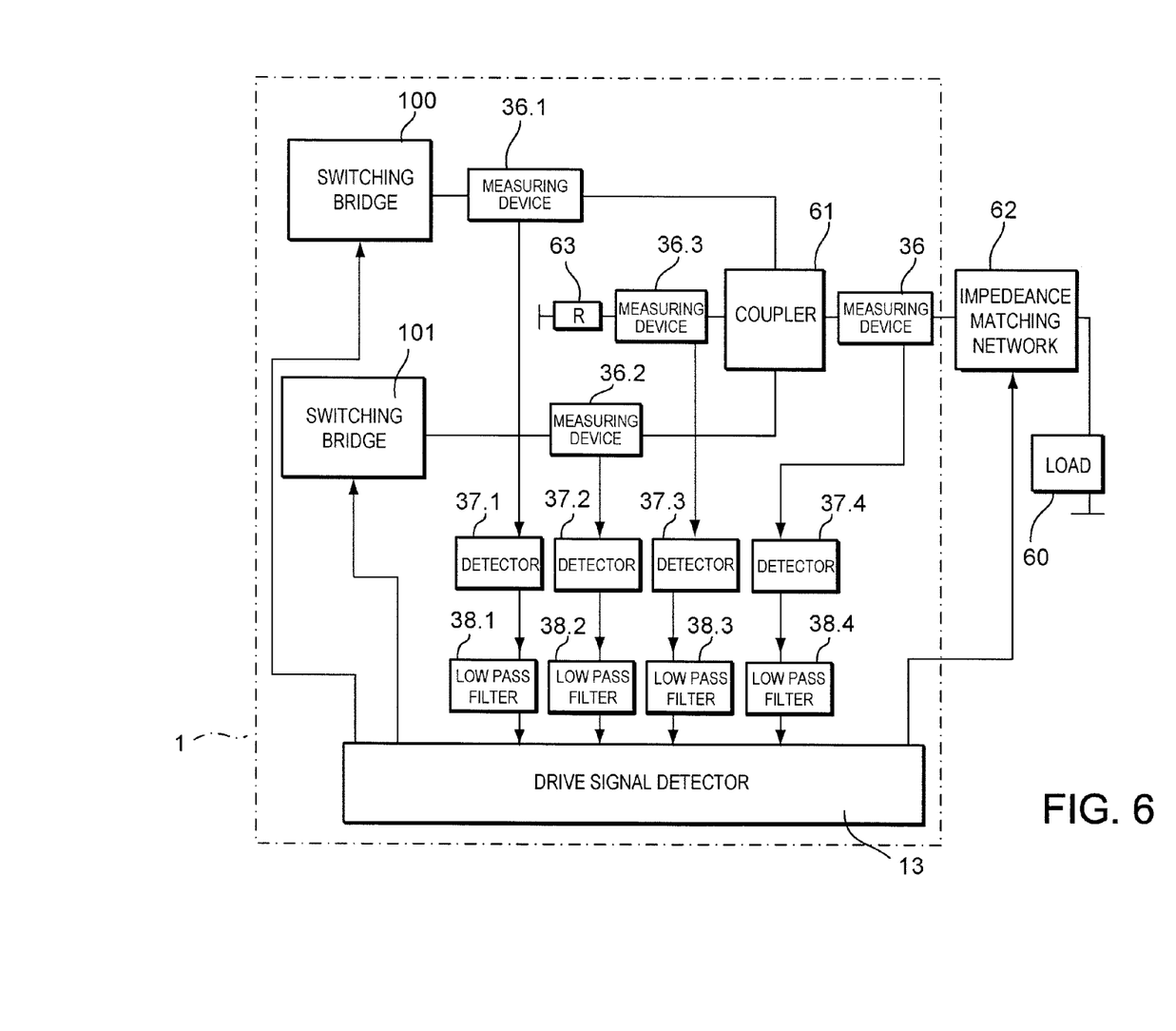
FIG. 6 shows a further construction of two coupled switching bridges with an explanation of the measurements carried out thereon.

FIG. 6 shows a similar diagram to that of FIG. 4. In addition to the measuring device 36, further measuring devices 36.1, 36.2 are provided at the outputs of the switching bridges 100, 102. Furthermore, a measuring device 36.3 is provided upstream of the absorber resistance 63. The measuring devices 36, 36.1, 36.2. 36.3 can either measure the time-dependent signals at these points, or just the amplitudes of the time-dependent signals can be detected and further parameters can be calculated from these. Detectors 37.1, 37.2, 37.3 and low-pass filters 38.1, 38.2, 38.3 are also connected downstream of the measuring devices 36.1, 36.2, 36.3.

Figure 7:
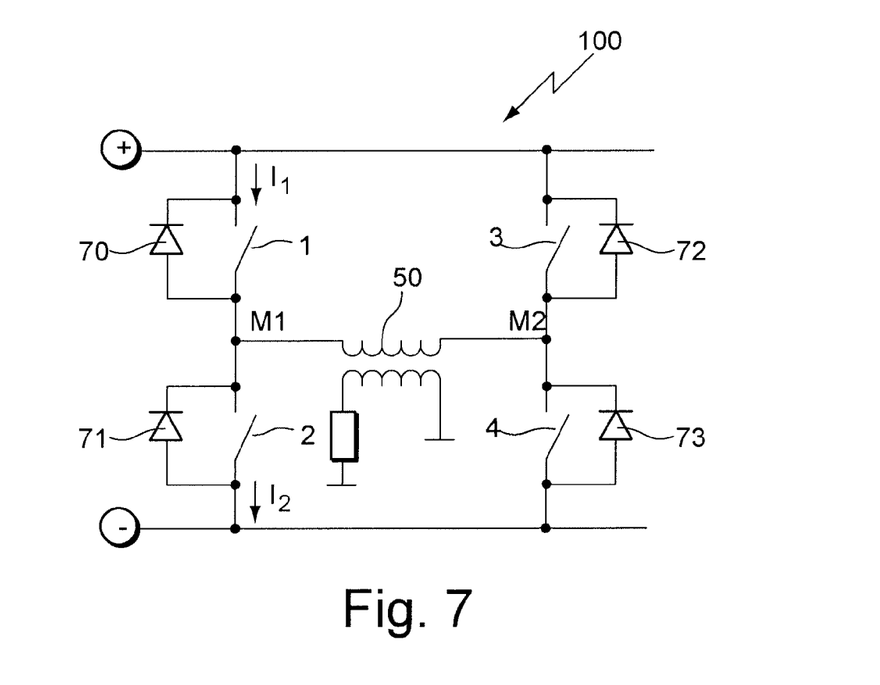
FIG. 7 shows a construction of a switching bridge, in which the body diodes of the switching elements are marked.

FIG. 7 shows a simplified diagram of a switching bridge 100, in which the body diodes 70 to 73 of the switching elements 1 to 4 are marked. The midpoints of the half-bridges are denoted by M1 and M2. In addition, the currents I1 and I2 are marked.

For the following Figures, the times, currents and on-states marked are illustrated purely diagrammatically and are not to scale.

Figure 8:
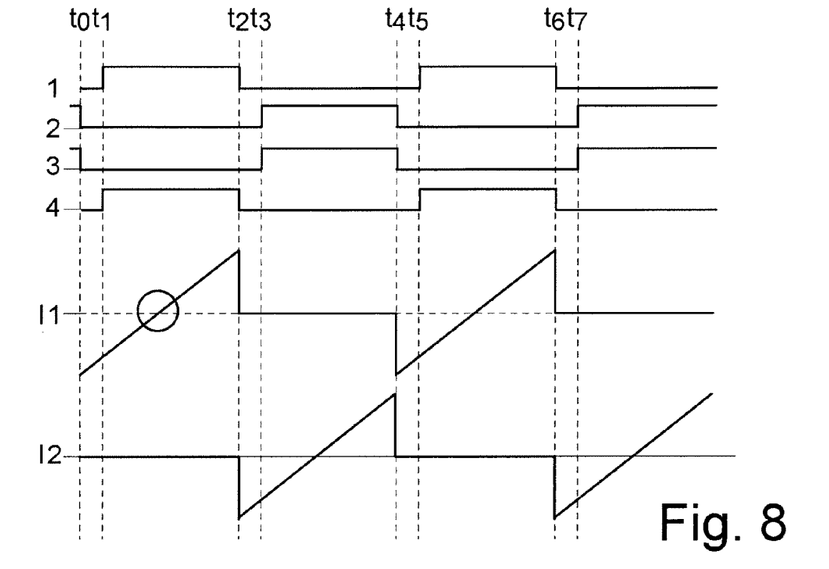
FIG. 8 shows a diagram of on-states of the switching elements of the switching bridge according to FIG. 7 and the currents caused thereby through the switching bridge for normal operation.

FIG. 8 shows the on-states of the switching elements 1 to 4, here, a low signal level corresponds to the off-state and a high signal level corresponds to the on-state. In normal operation, which is illustrated in FIG. 8, at t0 the switching elements 2 and 3 switch off. The current through the output transformer 50, which has a parasitic inductance, is carried by the body diodes 70, 73 of the switching elements 1 and 4, until at t1 the switching elements 1 and 4 switch on. The switching elements 2 and 3 are not allowed to switch on, before the current I1 had its zero crossing because after poling in the forward direction the body diodes 70 and 73 would also be conductive for a short time in the reverse direction. This case is shown in FIG. 9.

Figure 9:
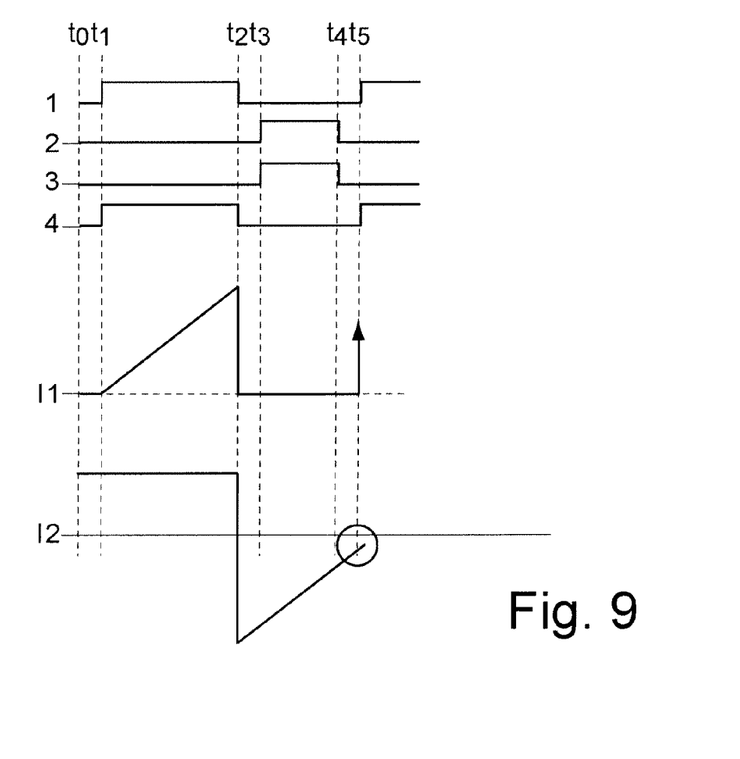
FIG. 9 shows a diagram corresponding to FIG. 8 at the start of operation of the switching bridge.

In FIG. 9, the switching elements 1 and 4 are switched on at start of operation and generate the current I1. No (reversed) initial current, which would have been produced in the switching elements of a previous current path across the switching elements 2 and 3 and the parasitic inductance, has to be compensated, so that I1 rises more than normally. If the opposite poling between the times t3 and t4 is then shorter, the current I2 is not yet zero when the switching elements 1 and 4 are switched on again, so that the body diodes 71, 72 (even at the reverse voltage now present) are still conductive for a short time and cause a short-circuit. Operation should therefore commence with on-times that rise slowly.

Figure 10:
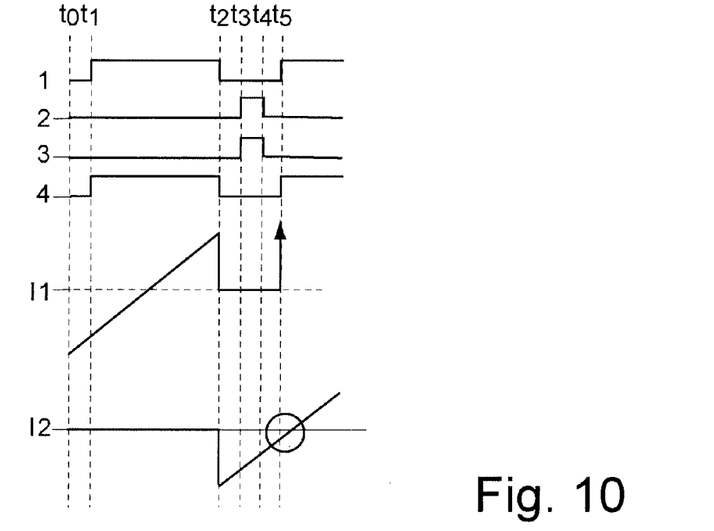
FIG. 10 shows a further diagram of a problematic case during operation of a switching bridge.

The same problematic case is illustrated in FIG. 10, not after switch-on, however, but during normal operation, when the switching times are not adhered to. Current peaks therefore occur.

Figure 11:
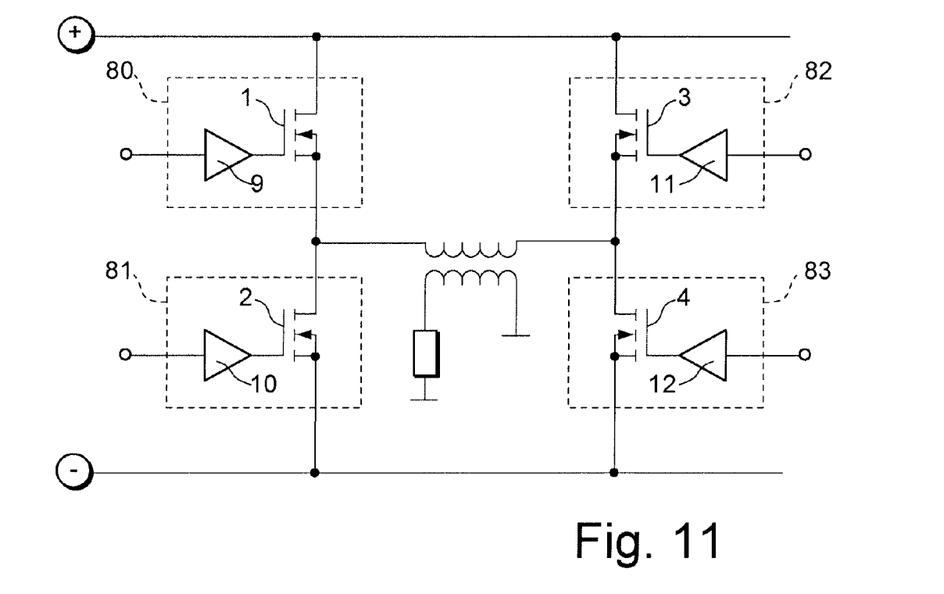
FIG. 11 shows a diagram of a switching bridge, in which the drivers and switching elements are each arranged in their own housing.

FIG. 11 illustrates that each switching element 1 to 4 and a respective driver 9 to 12 are arranged in a common housing 80 to 84.

Figure 12:
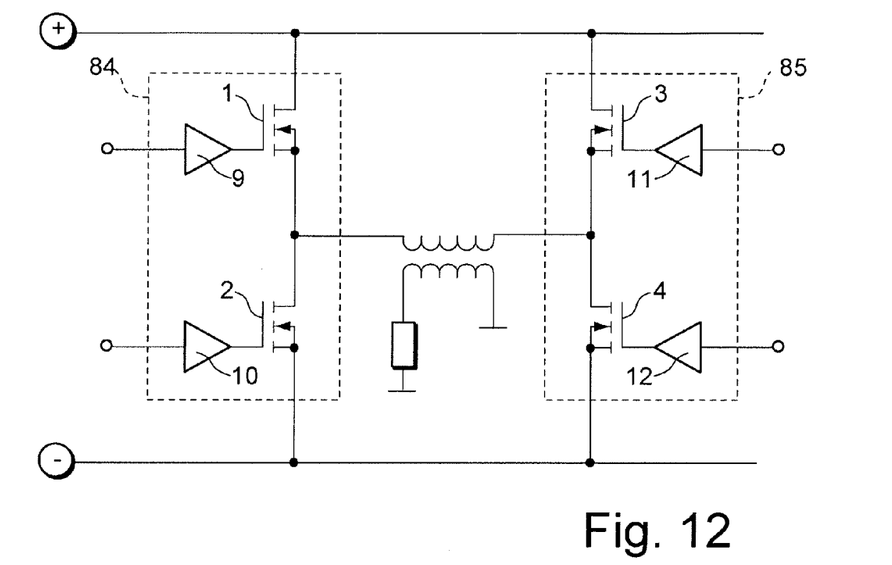
FIG. 12 shows a diagram of a switching bridge in which each half-bridge with associated drivers is arranged in a housing.

FIG. 12 illustrated that each half-bridge, comprising two switching elements 1 to 4 and two associated drivers 9 to 12, is arranged in its own housing 84, 85.

Figure 13:
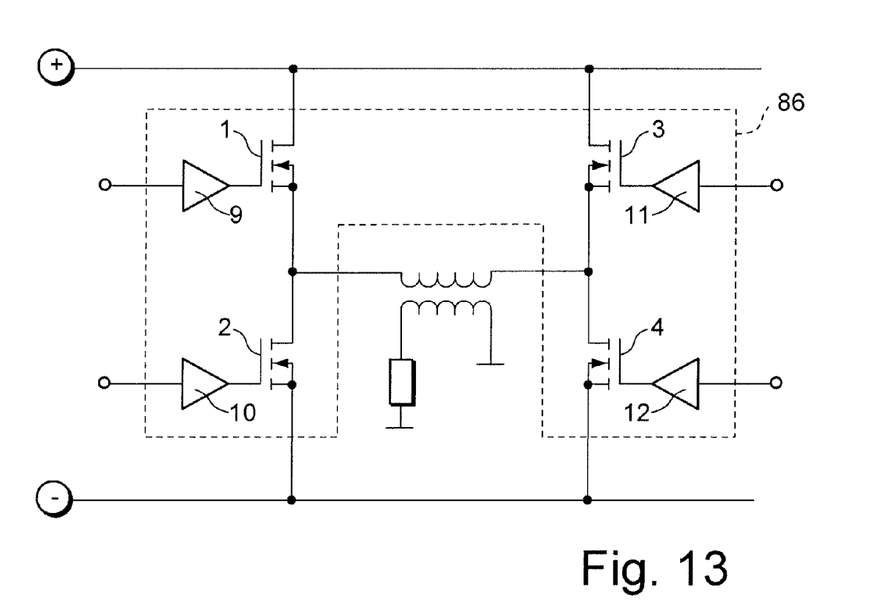
FIG. 13 shows a diagram in which an entire full bridge is arranged in a common housing.

In FIG. 13 an entire full bridge, comprising the switching elements 1 to 4 and the associated drivers 9 to 12, is arranged in a common housing 86.

What is claimed is:

1. A method of operating a power supply delivering a high frequency output signal having a power of more than 500 W and a substantially constant fundamental frequency greater than 3 MHz to a plasma load, the method comprising:

determining an operating parameter, an environmental parameter of a switching element or a switching bridge parameter;

generating individual drive signals for at least two switching elements of a switching bridge of the power supply as a function of the determined operating parameter, environmental parameter, or switching bridge parameter; and individually driving the switching elements of the power supply with respective ones of the generated drive signals in normal operation of the power supply;

wherein individually driving the switching elements includes driving the switching elements in a non-complimentary manner.

2. The method of claim 1, wherein determining the operating parameter, environmental parameter or switching bridge parameter comprises determining an electrical parameter.

3. The method of claim 2, wherein determining the electrical parameter comprises determining an amount of electrical current flowing through one of the switching elements, a voltage at one of the switching elements, a current path, or a voltage profile.

4. The method of claim 1, wherein determining the operating parameter, environmental parameter or switching bridge parameter comprises determining a temperature of one of the switching elements, as the environmental parameter.

5. The method of claim 1, wherein determining the operating parameter, environmental parameter or switching bridge parameter comprises determining a parameter indicative of a load impedance seen by the switching bridge, as the switching bridge parameter.

6. The method of claim 1, wherein individually driving the switching elements comprises variably driving the switching elements and analyzing a resulting change in the operating parameter, environmental parameter, or switching bridge parameter.

7. The method of claim 1, wherein individually driving the switching elements comprises briefly switching at least one of the switching elements on during a portion of the switching cycle when the switching element is normally open.

8. The method of claim 1, wherein one or more of the switching elements are maintained in a nonconductive state for one or more periods of the fundamental frequency.

9. A power supply configured to generate an output power greater than 500 W at a substantially constant fundamental frequency greater than 3 MHz, and to deliver a high-frequency output signal to a plasma load, by which, at least upon mismatching, reflected power is returned to the power supply, the power supply comprising:

a drive signal generator, which drives at least two drivers;

a switching bridge having at least two switching elements, each of the drivers associated with only a respective one of the switching elements; and at least one sensor connected to the drive signal generator and responsive to an operating parameter, a switching element environmental parameter, a switching bridge parameter, or a combination thereof;

wherein the power supply is configured such that, when the power supply is operated in normal operation while at least indirectly connected to a plasma load, the drive signal generator generates individual drive signals for the switching elements as a function of input from the sensor, and such that non-complimentary operation of the switching elements is enabled.

10. The power supply of claim 9, wherein one of the drivers and the associated switching element are arranged in a common housing.

11. The power supply of claim 9, wherein the switching elements and associated drivers are arranged in the form of a half bridge within a common housing.

12. The power supply of claim 9, wherein the switching elements and associated drivers are arranged in the form of a full bridge within a common housing.

13. The power supply of claim 9, wherein the drive signal generator drives drivers for all of the switching elements.

14. The power supply of claim 9, wherein the drive signal generator is in the form of a digital module.

15. The power supply of claim 14, wherein the digital module is a DSP.

16. The power supply of claim 9, further comprising an A/D converter connected downstream of the sensor.

17. The power supply of claim 9, wherein the switching bridge is a first switching bridge, the power supply further comprising a second switching bridge, and wherein outputs of the first and second switching bridges are coupled by way of a coupler.

* * * * *